United States Patent
Chen et al.

(10) Patent No.: US 9,915,778 B2
(45) Date of Patent: Mar. 13, 2018

(54) LED LAMP STRIP STRUCTURE AND CONTROL METHOD THEREOF, BACKLIGHT MODULE, LIQUID CRYSTAL DISPLAY DEVICE

(71) Applicants: Boe Technology Group Co., Ltd., Beijing (CN); Hefei Xinsheng Optoelectronics Technology Co., Ltd., Hefei, Anhui (CN)

(72) Inventors: He Chen, Beijing (CN); Yufei Hu, Beijing (CN); Hui Dong, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/038,349

(22) PCT Filed: Nov. 16, 2015

(86) PCT No.: PCT/CN2015/094717
§ 371 (c)(1),
(2) Date: May 20, 2016

(87) PCT Pub. No.: WO2016/197541
PCT Pub. Date: Dec. 15, 2016

(65) Prior Publication Data
US 2017/0168212 A1    Jun. 15, 2017

(30) Foreign Application Priority Data
Jun. 11, 2015 (CN) .......................... 2015 1 0317339

(51) Int. Cl.
*G09G 3/3225* (2016.01)
*F21V 8/00* (2006.01)
(Continued)

(52) U.S. Cl.
CPC .......... *G02B 6/009* (2013.01); *G02B 6/0068* (2013.01); *G02B 6/0073* (2013.01);
(Continued)

(58) Field of Classification Search
CPC ..... G09G 2310/0251; G09G 2310/027; G09G 2320/0209; G09G 2320/0252;
(Continued)

(56) References Cited

U.S. PATENT DOCUMENTS

2007/0253218 A1    11/2007   Tanabe
2009/0096741 A1*    4/2009   Kim ...................... G09G 3/342
                                                                345/102
(Continued)

FOREIGN PATENT DOCUMENTS

CN    101738784    6/2010
CN    101841949    9/2010
(Continued)

OTHER PUBLICATIONS

Office Action in Chinese Application No. 201510317339.9 dated Mar. 27, 2017, with English translation. 8 pages.
(Continued)

*Primary Examiner* — Douglas W Owens
*Assistant Examiner* — Wei Chan
(74) *Attorney, Agent, or Firm* — Womble Bond Dickinson (US) LLP

(57) ABSTRACT

Embodiments of the present invention provide an LED lamp strip structure, a backlight module, a liquid crystal display device and a method of controlling the LED lamp strip structure. The LED lamp strip structure comprises: a circuit board; and at least a first LED sequence and a second LED sequence arranged in parallel on the circuit board, the first LED sequence having a plurality of predetermined intervals,
(Continued)

and each LED in the second LED sequence corresponding to one of the plurality of predetermined intervals respectively.

17 Claims, 3 Drawing Sheets

(51) Int. Cl.
*H05B 33/08* (2006.01)
*H05K 1/02* (2006.01)

(52) U.S. Cl.
CPC ....... *H05B 33/089* (2013.01); *H05B 33/0815* (2013.01); *H05B 33/0821* (2013.01); *H05B 33/0845* (2013.01); *H05K 1/028* (2013.01); *H05K 2201/10106* (2013.01)

(58) Field of Classification Search
CPC ........ G09G 2320/0271; H05B 37/0281; H05B 33/08; H05B 33/0824; H05B 37/0227; H05B 33/0869; H05B 33/0884
USPC .... 345/8, 102, 690, 691, 179; 315/127, 129, 315/151, 153, 155, 161, 187, 192
See application file for complete search history.

(56) References Cited

U.S. PATENT DOCUMENTS

| | | | |
|---|---|---|---|
| 2010/0090530 A1* | 4/2010 | Watanabe | H05B 33/0815 307/37 |
| 2010/0182539 A1* | 7/2010 | Ohyama | G02B 6/0068 349/65 |
| 2013/0256705 A1* | 10/2013 | Huang | G02F 1/133615 257/88 |
| 2015/0003109 A1* | 1/2015 | Wu | G02B 6/0035 362/612 |

FOREIGN PATENT DOCUMENTS

| | | |
|---|---|---|
| CN | 101922644 A | 12/2010 |
| CN | 102625526 A | 8/2012 |
| CN | 102644879 | 8/2012 |
| CN | 102883505 A | 1/2013 |
| CN | 102913812 | 2/2013 |
| CN | 203384778 | 1/2014 |
| CN | 103851415 | 6/2014 |
| CN | 204358668 | 5/2015 |
| CN | 104930387 | 9/2015 |

OTHER PUBLICATIONS

International Search Report with English Language Translation dated Mar. 3, 2016, PCT Application No. PCT/CN2015/094717.
Office Action in Chinese Application No. 201510317339.9 dated Nov. 4, 2016, with English translation. 14 pages.
Decision on Rejection in Chinese Application No. 201510317339.9 dated Oct. 11, 2017, with English translation.

* cited by examiner

LED LAMP STRIP STRUCTURE AND CONTROL METHOD THEREOF, BACKLIGHT MODULE, LIQUID CRYSTAL DISPLAY DEVICE

The present application is the U.S. national phase entry of PCT/CN2015/094717, with an international filing date of Nov. 16, 2015, which claims the benefit of Chinese Patent Application No. 201510317339.9, filed on Jun. 11, 2015, the entire disclosures of which are incorporated herein by reference.

FIELD OF THE INVENTION

The present invention relates to the field of display technology, particularly to an LED lamp strip structure and a control method thereof, a backlight module, and a liquid crystal display device.

BACKGROUND OF THE INVENTION

In the existing LED lamp strips, hotspot phenomenon may occur due to nonuniform light mixing: as shown in FIG. 1, the light emission angle of LED 101 is less than 180 degrees; an area 102 where dark areas overlap may be generated between two adjacent LEDs 101, 101', and the luminance of this area would be distinctly lower than an area 103 that can be irradiated by LED light, thereby resulting in alternate bright spots and dark spots.

SUMMARY OF THE INVENTION

In view of this, an embodiment of the present invention provides an LED lamp strip structure, the LED lamp strip structure comprising:
a circuit board; and
at least a first LED sequence and a second LED sequence arranged in parallel on the circuit board, the first LED sequence having a plurality of predetermined intervals, and each LED in the second LED sequence corresponding to one of the plurality of predetermined intervals respectively.

In the LED lamp strip structure according to an embodiment of the present invention, two columns of LEDs are arranged on the circuit board in parallel, and the dark area generated by one column of lamp strips exactly falls within the bright area of the other column of lamp strips, thereby eliminating the hotspot phenomenon. By lightening one of the two columns of lamp strips alternately at a certain pulse frequency, the improving effect is more obvious than that of reducing the space between the LEDs; moreover, compared with a single column of lamp strips, two columns of lamp strips can be controlled by a circuit to choose which column of lamp strips will be lightened. By lightening two columns of lamp strips alternately at a preset frequency, the hotspot phenomenon can be eliminated in a more energy saving manner.

Optionally, the plurality of predetermined intervals of the first LED sequence are the same.

Arranging the LEDs in the LED sequence with the same interval can ensure the distribution of the bright areas of each LED to be more uniform, thereby enhancing illumination uniformity of the LED lamp stripe structure.

Optionally, LEDs in the first LED sequence and LEDs in the second LED sequence have the same size.

Constituting the first LED sequence and the second LED sequence using LEDs of the same size can enhance the illumination uniformity of the LED lamp stripe structure further.

Optionally, LEDs in the first LED sequence and LEDs in the second LED sequence have the same arrangement direction.

Arranging the LEDs in the first LED sequence and LEDs in the second LED sequence in the same arrangement direction enables the light emitted by the LEDs to be distributed in a substantially same direction, so as to benefit extraction of light.

Optionally, LEDs in the first LED sequence and LEDs in the second LED sequence have the same luminous parameters.

Constituting the first LED sequence and the second LED sequence using LEDs with the same luminous parameters can enhance the illumination uniformity of the LED lamp stripe structure further.

Optionally, the circuit board is a flexible circuit board.

Assembling the LED lamp strip structure using the flexible circuit board enables the LED lamp strip structure to be adapted for illumination devices, light emitting devices or display devices of different shapes.

Optionally, the LED lamp strip structure further comprises:
a pulse width generator for generating a frequency signal; and
a delayer and a phase inverter connected with the pulse width generator; the delayer and the phase inverter receive the frequency signal from the pulse width generator simultaneously, and the delayer and the phase inverter generate a first drive signal and a second drive signal with mutually opposite phases respectively.

In order to obtain two columns of signals with mutually opposite phases, a phase inverter can be used. The phase inverter has the function of time delay, so a delayer is used on another signal line; thus it can be ensured that the phase difference between the signal via the phase inverter and the signal via the delayer is 180 degrees, i.e., being mutually opposite.

Optionally, the delayer and the phase inverter provide the first drive signal and the second drive signal to the first LED sequence and the second LED sequence respectively, so as to enable the first LED sequence and the second LED sequence to emit light alternately.

Compared with a single column of lamp strips, two columns of lamp strips can be controlled by a circuit to choose which column of lamp strips will be lightened. By lightening two columns of lamp strips alternately at a preset frequency, the hotspot phenomenon can be eliminated in a more energy saving manner.

An embodiment of the present invention further provides a backlight module, the backlight module comprising:
a light guide plate, the light guide plate having a light entrance surface; and
an LED lamp strip structure as stated in the above embodiments, wherein light exit surfaces of the first LED sequence and the second LED sequence are opposite to the light entrance surface of the light guide plate.

An embodiment of the present invention further provides a liquid crystal display device, the liquid crystal display device comprising the backlight module stated in the above embodiment.

In the backlight module and the liquid crystal display device according to the embodiment of the present invention, two columns of LEDs are arranged on the circuit board in parallel, and the dark area generated by one column of lamp strips exactly falls within the bright area of the other column of lamp strips, thereby eliminating the hotspot phenomenon. By lightening one of the two columns of lamp strips alternately at a certain pulse frequency, the improving effect is more obvious than that of reducing the space between the LEDs; moreover, compared with a single column of lamp strips, two columns of lamp strips can be controlled by a circuit to choose which column of lamp strips will be lightened. By lightening two columns of lamp strips alternately at a preset frequency, the hotspot phenomenon can be eliminated in a more energy saving manner.

An embodiment of the present invention further provides a method of controlling an LED lamp strip structure as stated in the above embodiments, the method comprising:

providing a first drive signal and a second drive signal to the first LED sequence and the second LED sequence respectively; the first drive signal and the second drive signal have mutually opposite phases, so as to enable the first LED sequence and the second LED sequence to emit light alternately.

In the control method according to an embodiment of the present invention, two columns of LEDs are arranged on the circuit board in parallel, and the dark area generated by one column of lamp strips exactly falls within the bright area of the other column of lamp strips, thereby eliminating the hotspot phenomenon. By lightening one of the two columns of lamp strips alternately at a certain pulse frequency, the improving effect is more obvious than that of reducing the space between the LEDs; moreover, compared with a single column of lamp strips, two columns of lamp strips can be controlled by a circuit to choose which column of lamp strips will be lightened. By lightening two columns of lamp strips alternately at a preset frequency, the hotspot phenomenon can be eliminated in a more energy saving manner.

Optionally, providing a first drive signal and a second drive signal to the first LED sequence and the second LED sequence respectively comprises:

generating a frequency signal using a pulse width generator; and receiving the frequency signal from the pulse width generator simultaneously using a delayer and a phase inverter connected with the pulse width generator, and generating a first drive signal and a second drive signal with mutually opposite phases respectively using the delayer and the phase inverter.

Compared with a single column of lamp strips, two columns of lamp strips can be controlled by a circuit to choose which column of lamp strips will be lightened. By lightening two columns of lamp strips alternately at a preset frequency, the hotspot phenomenon can be eliminated in a more energy saving manner.

Optionally, frequencies of the first drive signal and the second drive signal are greater than 12 Hz.

Lightening the first LED sequence and the second LED sequence alternately at a frequency greater than 12 Hz prevents human eyes from being sensible of flickers of the LEDs obviously.

Optionally, frequencies of the first drive signal and the second drive signal are greater than 24 Hz.

Lightening the first LED sequence and the second LED sequence alternately at a frequency greater than 24 Hz can mitigate the extent of fatigue of human eyes further.

Optionally, frequencies of the first drive signal and the second drive signal are greater than 60 Hz.

Lightening the first LED sequence and the second LED sequence alternately at a frequency greater than 60 Hz can reduce stimulation of the LED flickers to human eyes further, thereby mitigating the extent of fatigue of human eyes further.

DETAILED DESCRIPTION OF THE INVENTION

Specific implementations of the LED lamp strip structure, the backlight module, the liquid crystal display device and the method of controlling the LED lamp strip structure provided by the embodiments of the present invention will be explained in detail with reference to the drawings.

Figure 1:
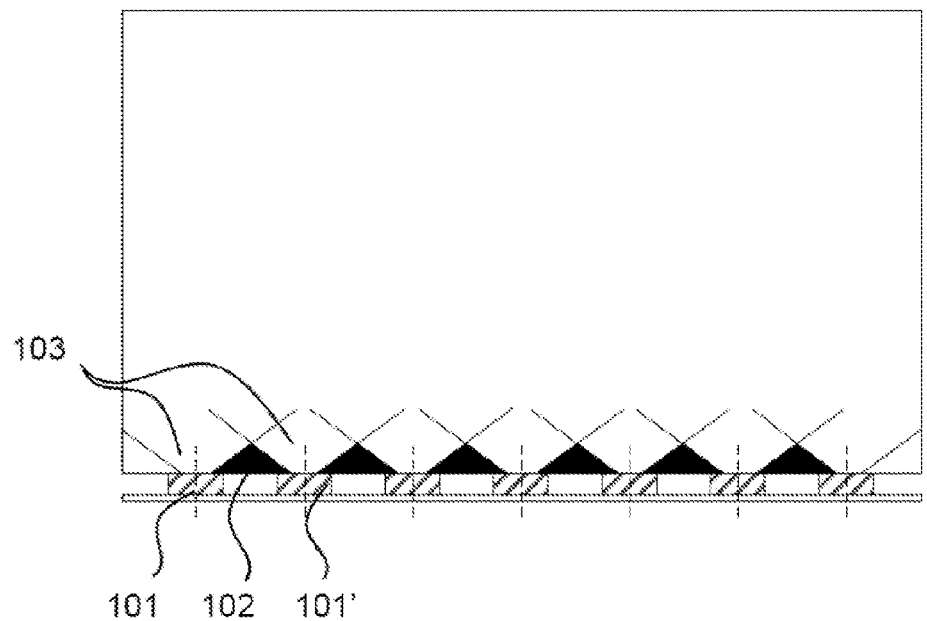
FIG. 1 shows a schematic view of principles of generation of hotspots in the prior art.
Figure 2:
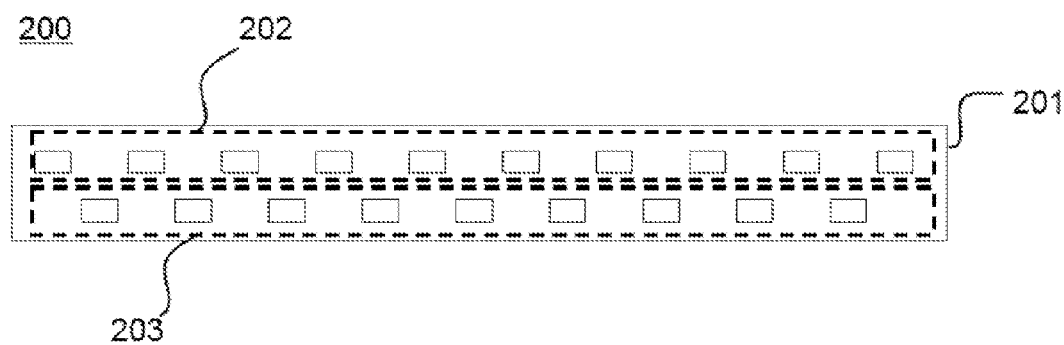
FIG. 2 shows a schematic view of an LED lamp strip structure according to an embodiment of the present invention.

FIG. 2 shows a schematic view of an LED lamp strip structure according to an embodiment of the present invention, wherein the LED lamp strip structure 200 comprises:

a circuit board 201; and at least a first LED sequence 202 and a second LED sequence 203 arranged in parallel on the circuit board 201, the first LED sequence 202 having a plurality of predetermined intervals, and each LED in the second LED sequence 203 corresponding to one of the plurality of predetermined intervals respectively.

In the LED lamp strip structure according to an embodiment of the present invention, two columns of LEDs are arranged on the circuit board in parallel, and the dark area generated by one column of lamp strips exactly falls within the bright area of the other column of lamp strips, thereby eliminating the hotspot phenomenon. By lightening one of the two columns of lamp strips alternately at a certain pulse frequency, the improving effect is more obvious than that of reducing the space between the LEDs; moreover, compared with a single column of lamp strips, two columns of lamp strips can be controlled by a circuit to choose which column of lamp strips will be lightened. By lightening two columns of lamp strips alternately at a preset frequency, the hotspot phenomenon can be eliminated in a more energy saving manner.

Optionally, the plurality of predetermined intervals of the first LED sequence 202 are the same.

Arranging the LEDs in the LED sequence with the same interval can ensure the distribution of the bright areas of each LED to be more uniform, thereby enhancing illumination uniformity of the LED lamp stripe structure.

Optionally, LEDs in the first LED sequence 202 and LEDs in the second LED sequence 203 have the same size.

Constituting the first LED sequence and the second LED sequence using LEDs of the same size can enhance the illumination uniformity of the LED lamp stripe structure further.

Optionally, LEDs in the first LED sequence and LEDs in the second LED sequence have the same arrangement direction.

Arranging the LEDs in the first LED sequence and LEDs in the second LED sequence in the same arrangement direction enables the light emitted by the LEDs to be distributed in a substantially same direction, so as to benefit extraction of light.

Optionally, LEDs in the first LED sequence and LEDs in the second LED sequence have the same luminous parameters.

Constituting the first LED sequence and the second LED sequence using LEDs with the same luminous parameters can enhance the illumination uniformity of the LED lamp stripe structure further.

Optionally, the circuit board 201 is a flexible circuit board.

Assembling the LED lamp strip structure using the flexible circuit board enables the LED lamp strip structure to be adapted for illumination devices, light emitting devices or display devices of different shapes.

Figure 3:
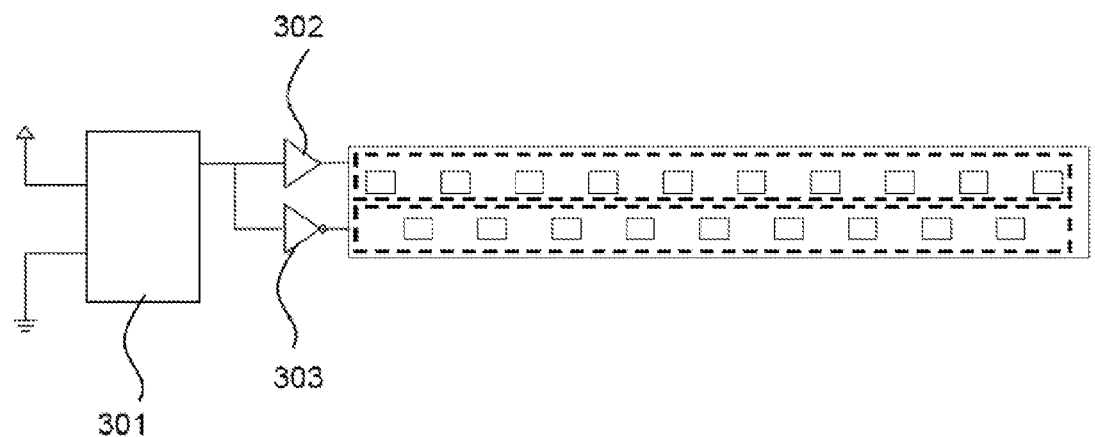
FIG. 3 shows a schematic view of a circuit for controlling an LED lamp strip structure according to an embodiment of the present invention.
Figure 4:
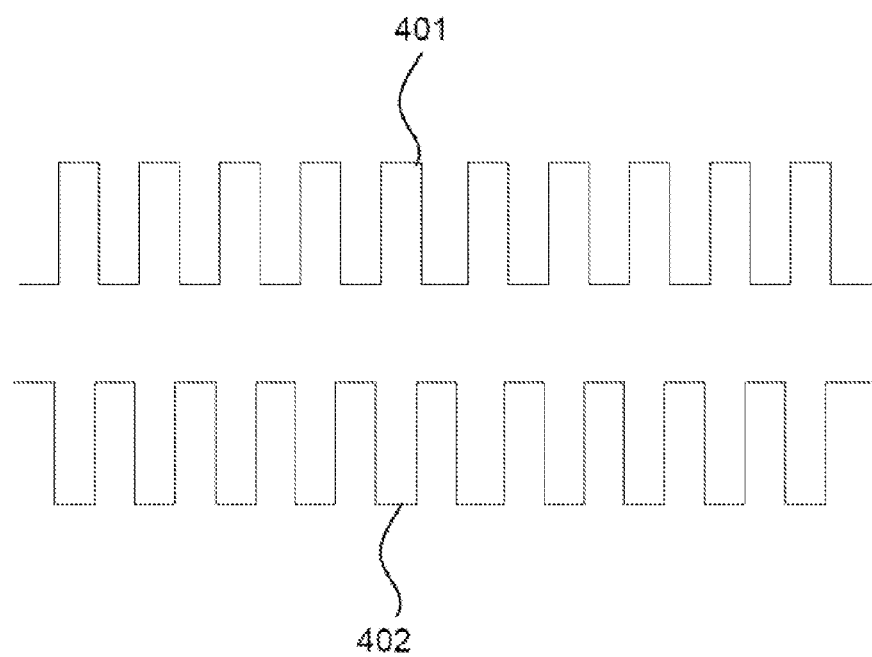
FIG. 4 shows a schematic view of a control signal of an LED lamp strip structure according to an embodiment of the present invention.

FIG. 3 shows a schematic view of a circuit for controlling an LED lamp strip structure according to an embodiment of the present invention; FIG. 4 shows a schematic view of a control signal of an LED lamp strip structure according to an embodiment of the present invention.

Optionally, as shown in FIG. 3, the LED lamp strip structure further comprises:

a pulse width generator 301 for generating a frequency signal; and a delayer 302 and a phase inverter 303 connected with the pulse width generator 301; the delayer 302 and the phase inverter 303 receive the frequency signal from the pulse width generator 301 simultaneously, and the delayer 302 and the phase inverter 303 generate a first drive signal 401 and a second drive signal 402 with mutually opposite phases respectively, as shown in FIG. 4.

In order to obtain two columns of signals with mutually opposite phases, a phase inverter can be used. The phase inverter has the function of time delay, so a delayer is used on another signal line, and thus it can be ensured that the phase difference between the signal via the phase inverter and the signal via the delayer is 180 degrees, i.e., being mutually opposite.

Optionally, the delayer 302 and the phase inverter 303 provide the first drive signal 401 and the second drive signal 402 to the first LED sequence 202 and the second LED sequence 203 respectively, so as to enable the first LED sequence 202 and the second LED sequence 203 to emit light alternately.

Compared with a single column of lamp strips, two columns of lamp strips can be controlled by a circuit to choose which column of lamp strips will be lightened. By lightening two columns of lamp strips alternately at a preset frequency, the hotspot phenomenon can be eliminated in a more energy saving manner.

Figure 5:
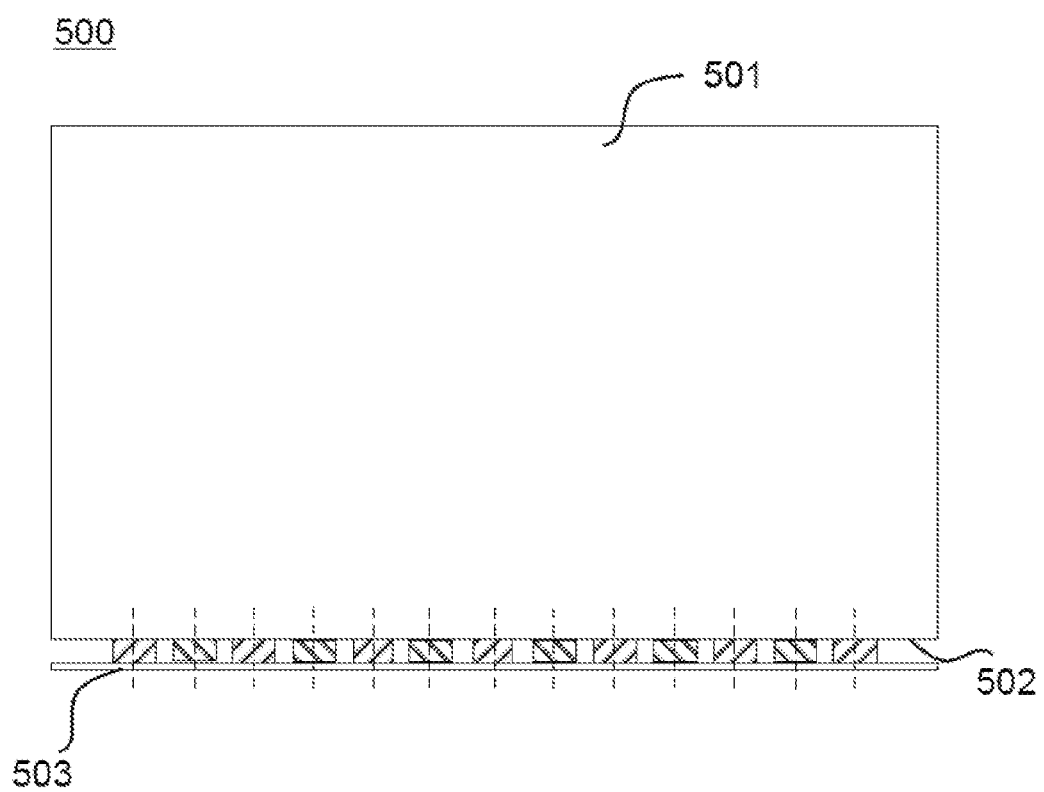
FIG. 5 shows a schematic view of a backlight module according to an embodiment of the present invention.

An embodiment of the present invention further provides a backlight module, as shown in FIG. 5, the backlight module 500 comprising:

a light guide plate 501, the light guide plate 501 having a light entrance surface 502; and an LED lamp strip structure 503 as stated in the above embodiments, wherein light exit surfaces of the first LED sequence and the second LED sequence are opposite to the light entrance surface 502 of the light guide plate 501.

An embodiment of the present invention further provides a liquid crystal display device, the liquid crystal display device comprising the backlight module stated in the above embodiment.

In the backlight module and the liquid crystal display device according to the embodiment of the present invention, two columns of LEDs are arranged on the circuit board in parallel, and the dark area generated by one column of lamp strips exactly falls within the bright area of the other column of lamp strips, thereby eliminating the hotspot phenomenon. By lightening one of the two columns of lamp strips alternately at a certain pulse frequency, the improving effect is more obvious than that of reducing the space between the LEDs; moreover, compared with a single column of lamp strips, two columns of lamp strips can be controlled by a circuit to choose which column of lamp strips will be lightened. By lightening two columns of lamp strips alternately at a preset frequency, the hotspot phenomenon can be eliminated in a more energy-saving manner.

An embodiment of the present invention further provides a method of controlling an LED lamp strip structure as stated in the above embodiments, the method comprising:

providing a first drive signal and a second drive signal to the first LED sequence and the second LED sequence respectively; the first drive signal and the second drive signal have mutually opposite phases, so as to enable the first LED sequence and the second LED sequence to emit light alternately.

In the control method according to an embodiment of the present invention, two columns of LEDs are arranged on the circuit board in parallel, and the dark area generated by one column of lamp strips exactly falls within the bright area of the other column of lamp strips, thereby eliminating the hotspot phenomenon. By lightening one of the two columns of lamp strips alternately at a certain pulse frequency, the improving effect is more obvious than that of reducing the space between the LEDs; moreover, compared with a single column of lamp strips, two columns of lamp strips can be controlled by a circuit to choose which column of lamp strips will be lightened, by lightening two columns of lamp strips alternately at a preset frequency, the hotspot phenomenon can be eliminated in a more energy saving manner.

Optionally, providing a first drive signal and a second drive signal to the first LED sequence and the second LED sequence respectively comprises:

generating a frequency signal using a pulse width generator; and receiving the frequency signal from the pulse width generator simultaneously using a delayer and a phase inverter connected with the pulse width generator, and generating a first drive signal and a second drive signal with mutually opposite phases respectively using the delayer and the phase inverter.

Compared with a single column of lamp strips, two columns of lamp strips can be controlled by a circuit to choose which column of lamp strips will be lightened. By lightening two columns of lamp strips alternately at a preset frequency, the hotspot phenomenon can be eliminated in a more energy saving manner.

Optionally, frequencies of the first drive signal and the second drive signal are greater than 12 Hz.

Lightening the first LED sequence and the second LED sequence alternately at a frequency greater than 12 Hz prevents human eyes from being sensible of flicker of the LEDs obviously.

Optionally, frequencies of the first drive signal and the second drive signal are greater than 24 Hz.

Lightening the first LED sequence and the second LED sequence alternately at a frequency greater than 24 Hz can further mitigate the extent of fatigue of human eyes.

Optionally, frequencies of the first drive signal and the second drive signal are greater than 60 Hz.

Lightening the first LED sequence and the second LED sequence alternately at a frequency greater than 60 Hz can reduce stimulation of the LED flicker to human eyes further, thereby mitigating the extent of fatigue of human eyes further.

According to an embodiment of the present invention, two columns of LEDs are arranged on the circuit board in parallel, and the dark area generated by one column of lamp strips exactly falls within the bright area of the other column of lamp strips, thereby eliminating the hotspot phenomenon. By lightening one of the two columns of lamp strips alternately at a certain pulse frequency, the improving effect is more obvious than that of reducing the space between the LEDs; moreover, compared with a single column of lamp strips, two columns of lamp strips can be controlled by a circuit to choose which column of lamp strips will be lightened. By lightening two columns of lamp strips alternately at a preset frequency, the hotspot phenomenon can be eliminated in a more energy saving manner.

Apparently, the skilled person in the art can make various modifications and variations to the present invention without departing from the spirit and the scope of the present invention. In this way, provided that these modifications and variations of the present invention belong to the scopes of the claims of the present invention and the equivalent technologies thereof, the present invention also intends to encompass these modifications and variations.

The invention claimed is:

1. An LED lamp strip structure, comprising:
 a circuit board;
 at least a first LED sequence and a second LED sequence arranged in parallel on the circuit board, the first LED sequence having a plurality of predetermined intervals, and each LED in the second LED sequence corresponding to one of the plurality of predetermined intervals respectively;
 a pulse width generator for generating a frequency signal; and
 a delayer and a phase inverter connected with the pulse width generator;
 wherein the delayer and the phase inverter receive the frequency signal from the pulse width generator simultaneously, and the delayer and the phase inverter generate a first drive signal and a second drive signal with mutually opposite phases respectively.

2. The LED lamp strip structure as claimed in claim 1, wherein the plurality of predetermined intervals of the first LED sequence are the same.

3. The LED lamp strip structure as claimed in claim 1, wherein LEDs in the first LED sequence and LEDs in the second LED sequence have the same size.

4. The LED lamp strip structure as claimed in claim 1, wherein LEDs in the first LED sequence and LEDs in the second LED sequence have the same arrangement direction.

5. The LED lamp strip structure as claimed in claim 1, wherein LEDs in the first LED sequence and LEDs in the second LED sequence have the same luminous parameters.

6. The LED lamp strip structure as claimed in claim 1, wherein the circuit board is a flexible circuit board.

7. The LED lamp strip structure as claimed in claim 1, wherein the delayer and the phase inverter provide the first drive signal and the second drive signal to the first LED sequence and the second LED sequence respectively, so as to enable the first LED sequence and the second LED sequence to emit light alternately.

8. A backlight module, comprising:
 a light guide plate, the light guide plate having a light entrance surface; and
 an LED lamp strip structure as claimed in claim 1, wherein light exit surfaces of the first LED sequence and the second LED sequence are opposite to the light entrance surface of the light guide plate.

9. A liquid crystal display device, comprising the backlight module as claimed in claim 8.

10. The backlight module as claimed in claim 8, wherein the plurality of predetermined intervals of the first LED sequence are the same.

11. The backlight module as claimed in claim 8, wherein LEDs in the first LED sequence and LEDs in the second LED sequence have the same size.

12. The backlight module as claimed in claim 8, wherein LEDs in the first LED sequence and LEDs in the second LED sequence have the same arrangement direction.

13. The backlight module as claimed in claim 8, wherein the delayer and the phase inverter provide the first drive signal and the second drive signal to the first LED sequence and the second LED sequence respectively, so as to enable the first LED sequence and the second LED sequence to emit light alternately.

14. A method of controlling an LED lamp strip structure, comprising: providing a first drive signal and a second drive signal to a first LED sequence and a second LED sequence respectively; the first drive signal and the second drive signal have mutually opposite phases, so as to enable the first LED sequence and the second LED sequence to emit light alternately; wherein providing a first drive signal and a second drive signal to the first LED sequence and the second LED sequence respectively comprises: generating a frequency signal using a pulse width generator; and receiving the frequency signal from the pulse width generator simultaneously using a delayer and a phase inverter connected with the pulse width generator, and generating a first drive signal and a second drive signal with mutually opposite phases respectively using the delayer and the phase inverter.

15. The method as claimed in claim 14, wherein frequencies of the first drive signal and the second drive signal are greater than 12 Hz.

16. The method as claimed in claim 14, wherein frequencies of the first drive signal and the second drive signal are greater than 24 Hz.

17. The method as claimed in claim 14, wherein frequencies of the first drive signal and the second drive signal are greater than 60 Hz.

* * * * *